United States Patent [19]

Bradford

[11] Patent Number: 5,613,610

[45] Date of Patent: *Mar. 25, 1997

[54] NATURALLY DEGRADABLE AND RECYCLABLE STATIC-DISSIPATIVE PACKAGING MATERIAL

[75] Inventor: Judson A. Bradford, Holland, Mich.

[73] Assignee: Bradford Company, Holland, Mich.

[*] Notice: The portion of the term of this patent subsequent to Jun. 11, 2011, has been disclaimed.

[21] Appl. No.: 384,605

[22] Filed: Feb. 3, 1995

Related U.S. Application Data

[63] Continuation of Ser. No. 944,698, Sep. 14, 1992, abandoned, which is a continuation-in-part of Ser. No. 739,866, Aug. 2, 1991, abandoned, which is a continuation-in-part of Ser. No. 585,718, Sep. 20, 1990, abandoned, which is a continuation-in-part of Ser. No. 336,733, Apr. 12, 1989, Pat. No. 4,966,280, which is a continuation-in-part of Ser. No. 190,044, May 4, 1988, abandoned.

[51] Int. Cl.$^6$ .......................... B65D 81/00; B65D 25/14
[52] U.S. Cl. .................. 206/721; 206/524.2; 428/34.2
[58] Field of Search ........................... 206/328, 334, 206/701, 719, 721, 524.2; 428/34.2, 35.6, 35.7, 500, 507, 510, 511, 512

[56] References Cited

U.S. PATENT DOCUMENTS

| 4,154,344 | 5/1979 | Yenni et al. . | |
|---|---|---|---|
| 4,156,751 | 5/1979 | Yenni et al. . | |
| 4,293,070 | 10/1981 | Ohlbach | 206/328 |
| 4,424,900 | 1/1984 | Petcavich | 206/328 |
| 4,482,048 | 11/1984 | Blodgett . | |

(List continued on next page.)

FOREIGN PATENT DOCUMENTS

| 2516293 | 5/1983 | France . |
| 0023159 | 2/1985 | Japan . |
| 0071800 | 4/1985 | Japan . |
| 0081400 | 5/1985 | Japan . |
| 2041241 | 2/1987 | Japan . |
| 2131382 | 6/1984 | United Kingdom . |

OTHER PUBLICATIONS

Palkaline Engineering, vol. 28 #1, pp. 104–107 "Transparent Bags Foil Static Electricity's Zap".

Fox Valley Enquirer, Oct. 1990, vol. 1, "Zelec ECP Electroconductive Powders for Imparting Electrical Conductivity and Antistatic properties." Dupont.

"The Application of Zelec ECP in static dissipative systems." Paul J. Capano and H. Richard Linton, E.I. du Pont De Nemours & Company, Chemicals and Pigments Department.

"Nicolet Paper Company" Paper, Film & Foil Converter, 1991 Trade Show in Print.

Package Converting, "Studies Indicate Cellophane Environmentally Friendly," Dec. 1990, Paper, Film & Foil Converter.

"Nonchemical Static–Safe Packaging Material is Transparent and Biodegradable" Evaluation Engineering, Mar., 1990.

ESD—Control Myths, Old and New, p. 18 EOS/ESD Technology Humidity and Temperature Effects on Surface Resistivity, Evaluation Engineering—Oct. 1990.

*Primary Examiner*—Jacob K. Ackun
*Attorney, Agent, or Firm*—Wood, Herron & Evans

[57] ABSTRACT

A naturally degradable and recyclable static-dissipative packaging material has a layer of relatively rigid paperboard laminated to at least one film of permanently static-dissipative glassine or cellophane. Containers, and dividers and pads used in the containers, are formed from this composite material to protect packaged articles sensitive to electrostatic discharge. The permanently static-dissipative film of glassine or cellophane is electrostatically volume dissipative, so as to prevent an electrostatic charge from being held and then discharged when articles are inserted into, and/or removed from the containers. A metallized internal surface of the laminated glassine or cellophane forms a Faraday cage around a packaged article. For metallized or unmetallized embodiments, with either one or two films of glassine or cellophane, all the components of this packaging material are considered biodegradable and repulpable.

27 Claims, 1 Drawing Sheet

U.S. PATENT DOCUMENTS

| | | | |
|---|---|---|---|
| 4,496,406 | 1/1985 | Dedow . | |
| 4,528,222 | 7/1985 | Rzpecki et al. | 206/328 X |
| 4,553,190 | 11/1985 | Mueller . | |
| 4,610,353 | 9/1986 | Young . | |
| 4,623,594 | 11/1986 | Keough . | |
| 4,647,714 | 3/1987 | Goto . | |
| 4,658,958 | 4/1987 | McNulty et al. . | |
| 4,677,809 | 7/1987 | Long et al. . | |
| 4,684,020 | 8/1987 | Ohlbach . | |
| 4,685,563 | 8/1987 | Cohen et al. . | |
| 4,699,830 | 10/1987 | White . | |
| 4,707,414 | 11/1987 | Long et al. | 206/328 X |
| 4,711,702 | 12/1987 | Hood . | |
| 4,712,674 | 12/1987 | Young . | |
| 4,756,414 | 7/1988 | Mott . | |
| 4,767,003 | 8/1988 | Rice et al. . | |
| 4,773,534 | 9/1988 | DeHeras et al. . | |
| 4,792,042 | 12/1988 | Koehn et al. . | |
| 4,882,894 | 11/1989 | Havens et al. | 206/328 X |
| 5,205,406 | 4/1993 | Bradford | 206/328 |

NATURALLY DEGRADABLE AND RECYCLABLE STATIC-DISSIPATIVE PACKAGING MATERIAL

This application is a continuation of application Ser. No. 07/944,698 filed Sep. 14, 1992, and now abandoned, which is a Continuation-in-Part application of U.S. patent application Ser. No. 07/739,866, filed Aug. 2, 1991, and now abandoned, which is a Continuation-in-Part application of U.S. patent application Ser. No. 07/585,718, filed Sep. 20, 1990, and now abandoned, which is a Continuation-in-Part application of U.S. patent application Ser. No. 07/336,733, filed Apr. 12, 1989, now U.S. Pat. No. 4,966,280, which is in turn a Continuation-in-Part application of U.S. application Ser. No. 07/190,044 filed May 4, 1988, and now abandoned, all of which applications are assigned to the assignee of this application.

This invention relates to relatively rigid multiple-ply static-dissipative packaging materials and, particularly, paperboard materials useful for packaging articles adversely affected by an electrostatic field or discharge.

BACKGROUND OF THE INVENTION

Static discharge is a naturally occurring electrical phenomenon. Triboelectric charge, often referred to as static electricity, can build up in common materials to some degree, and is eventually discharged as the charge traverses a path toward an electrical ground. Static electricity buildup is usually strongest in insulative materials because they discharge so slowly.

Circuit boards contain microcircuitry which can be easily damaged by electrostatic discharges of relatively small magnitude. Magnitudes of human body potential as small as 50 volts can permanently damage these devices. For comparative purposes, to illustrate the extreme sensitivity of microcircuits to this phenomenon, a visible charge from a human hand to a door knob in winter will often exceed 10,000 volts. Thus, extreme caution must be taken in protecting such microcircuit components from electrostatic charge.

To provide protection from electrostatic discharge for packaged articles, a principle of physics referred to as the Faraday cage effect is often employed. Electricity does not penetrate a conductive enclosure. The static electric charge will go around the enclosed space, distributing itself to produce an equipotential surface with zero electrical field inside. By surrounding a static sensitive article with a conductive enclosure, the article is shielded from electrostatic fields and discharges originating outside of the enclosure.

In my co-pending U.S. patent application Ser. No. 07/336,733, I have disclosed a multiple-ply anti-static paperboard product for use in Faraday cage-type packaging of electrostatically sensitive articles, such as semi-conductor components and electronic circuit boards. The multiple-ply paperboard product comprises a layer of high-carbon content paperboard sandwiched between two layers of static-dissipative material. Such multiple-ply paperboard is particularly useful in the manufacture of dividers, pads and walls of containers for packaging articles which are required to be shielded from exposure to static discharge.

The packaging material described in the above-identified application has been found to be very beneficial in the protection of articles against damage by static electricity, but in many instances, that material affords more protection against certain types of static electricity and less protection against other types of static electricity than is required for specific applications. Specifically, and as one example, many applications require only protection against static electricity generated internally of the package either by an electrical component or article rubbing against a portion of the package or by one portion of the package rubbing against another portion of the package. In applications of this type, there is no need for the electrical conductivity of the center ply of this multiple-ply anti-static material.

It has therefore been an objective to provide a multiple-ply package material which may be utilized in the manufacture of a container or portion of a container and which provides effective protection against damage to products or articles packaged in the container resulting from static electricity to which the package may be subjected.

One attempt at protecting static electricity sensitive articles against static electricity is disclosed in U.S. Pat. No. 4,658,985, to McNulty. This patent discloses a bag having two plies of anti-static (polyethylene) material and an electrically conductive fabric or mat embedded therebetween to provide a shield from electrostatic discharge for a bagged article. Because the bag is lined with an anti-static material, it affords protection against electrostatic charge generated internally of the package, but the bag does not, by itself, provide adequate rigidity for physical protection of a microcircuit component. In order to provide physical protection, the bagged article must be placed within another cell in a rigid container. This results in additional material and material handling costs requiring a bag enclosure, additional labor costs associated with bagging the component or article, and additional shipping costs due to reduced packaging density. Reduced packaging density is due to the fact that each cell of a container which must hold an article within a bag, rather than just the article itself, occupies more space than the article alone. Thus, for a container having a given volume, use of bag packaging necessitates larger size cells, resulting in the packaging of fewer articles per container.

Another technique for protecting static electricity sensitive articles against static electricity is disclosed in U.S. Pat. No. 4,623,594 to Keough. This patent discloses that a mixture of prepolymer and anti-static agent may be applied to a substrate, such as polypropylene fiber or paper or glass, and then cured to the anti-static agent by contacting the mixture with electron beam radiation. Because the mixture is cured in situ, after application to the substrate, this technique is very limited in its application and, to date, has only been applied commercially to bag materials and vacuum formable sheets of plastic. While this treatment does provide some protection against generation of static electricity, it is very expensive and is not particularly suitable for protective materials which are either all dissipative or all conductive.

Additionally, for physical protection, articles protected against static electricity by material treated in accordance with the disclosure of this patent must be enclosed within a bag, and that bag, if it is to be physically protected, must be packaged in another rigid container. This again results in additional material and material handling costs, as well as reduced packaging density.

Heretofore, anti-static materials have also been applied to a cardboard substrate, but that cardboard substrate-applied anti-static material, usually low-density polyethylene, has been rendered anti-static by being doped with a chemical anti-static additive, generally some form of amine. Unfortunately, amines have several undesirable characteristics when used to impart anti-static properties to packaging materials. First of all, amines do not render the material to which they are added permanently anti-static. Rather, that anti-static coating of material loses its anti-static property over a period of time. Otherwise expressed, that amine-doped material has a relatively short shelf life because the amines, trapped within the plastic, evaporate or outgas with time from the plastic or other material within which the amine is trapped such that the plastic loses its anti-static property. Secondly, the amine may be very corrosive to some metals, including the metals from which many microcircuits are manufactured. Consequently, the amine, outgassing from the anti-static plastic, can, and often does, corrode and impair the surface electrical characteristics of the component which the anti-static material is intended to protect. Additionally, the amines, and more particularly the chemicals which result from amine breakdown, will often outgas from the anti-static plastic and chemically attack the polycarbonate upon which many microcircuits are applied. In the course of attacking the polycarbonate, the chemicals produced by amine breakdown often cause stress cracks, and ultimately failure. Additionally, the electrical properties of the amines contained in the anti-static plastic are humidity dependent, meaning that the amine-doped plastic intended to afford protection to articles contained in a package of the amine-containing anti-static material is not effective in an atmosphere having a certain minimum humidity level. In some atmospheres, such as those which are very dry, as in dry areas of the United States, amine-containing anti-static plastic materials may not be suitably anti-static. While charge production may be somewhat reduced in these drier areas, it is not reduced enough to substantially eliminate the risk of damage.

Another anti-static coating may be in the form of an acrylic or other polymeric spray. However, such sprays are not permanently anti-static/static dissipative, and usually those sprays are also hygroscopic. That is, they may combine with water vapor and cause undesired water deposition on the surface of the board.

Another concern relates to the environmental and economical impact of packaging materials, which are often discarded after a finite number of uses. It would be environmentally and economically advantageous to manufacture packaging material from components that are more durable and thereby can be reused more often, made with recycled materials, recyclable themselves, can be safely incinerated or are naturally degradable. This helps the environment and eliminates the ever-increasing costs of special handling and/or waste disposal associated with non-recyclable material.

For packaging materials such as paperboard, the word "recyclable" generally means that the components are repulpable for subsequent use in other paper or paperboard articles. The phrase "naturally degradable" generally means that the material breaks down into nonhazardous, constitute compounds or elements within a reasonable time under normal environmental conditions. For instance, photodegradable materials are broken down by the effects of ultraviolet rays from sunlight. Some materials may oxidize and wear away after prolonged exposure to the atmosphere. For the purpose of this application, materials that are biodegradable, ultraviolet light degradable, or oxidizable are considered naturally degradable.

In other packaging applications, biodegradable materials have been used in loose form within packages, in lieu of styrofoam. Biodegradable materials in pliable form, such as bags, have also been used.

However, prior to the invention described in this application, applicant was unaware of any other successful attempt to provide a relatively rigid packaging material developed to specifically address both the concerns of protecting packaged articles from static electricity and minimizing adverse impact on the environment.

SUMMARY OF THE INVENTION

The invention of this application which accomplishes this objective comprises a relatively rigid ply of paperboard or like material to which at least one film or ply of permanently static-dissipative glassine or cellophane is applied.

In the preferred embodiment, the permanently static-dissipative film, such as glassine or cellophane, is metallized on an inner surface and the inner surface is adhered onto the paperboard via glue. The resulting packaging material is both naturally degradable and recyclable.

By sandwiching a paperboard between two such films of metallized galassine or cellophane, articles inside an enclosure formed from such product are protected by both a Faraday shield and the static dissipative properties of the interior surface. External charging is minimized by the outer static dissipative surface. The film is permanently static-dissipative, and it is also amine free. This packaging material is repulpable so that it may be recycled, and it is also biodegradable so that it does not present an environmental problem when disposed after its useful life.

When using a metallized film of glassine or cellophane to provide a Faraday cage, metallization is preferably performed by vacuum metallic evaporation of nickel, aluminum, copper or iron particles on one side of the ply, the side which resides in surface contact with the rigid ply of paperboard. Metallization may also be performed by sputtering.

In attempting to address environmental concerns with this novel packaging material, applicant also solved an only recently recognized problem of potentially damaging discharge of static electricity from some nominally protective packaging materials. This phenomenom occurs with electrically shielding materials in which a conductive shielding layer is buried under an insulative layer, with or without a static dissipative outer surface. The conductive layer can become charged from exposure to high voltages in the environment which penetrate the insulative layer. This conductive layer then cannot be discharged to a low level of charge in a reasonable length of time when the container is grounded due to the insulative layer which effectively blocks current flow at voltages which, while lower than the charging voltage, are still unacceptably high. The container may, under certain usage conditions, discharge to sensitive items external to the package. The package is effectively a charged capacitor with a very slow leakage.

This invention solves this problem because the outer film of either glassine or cellophane has a relatively low volume resistivity and any charge impressed on the package can be readily discharged through this film to a grounded surface.

In forming the outer layers for all embodiments described hereinabove, a corrosion inhibitor may be added to protect the packaged article from chemical corrosion. To provide chemical protection, the added corrosion inhibitor neutralizes potentially corrosive elements in the environment, thereby protecting the article from the damaging chemical compounds.

These and other objects and advantages of the invention will become more apparent from the following detailed description of the invention in which: dr

DETAILED DESCRIPTION OF THE DRAWINGS

Many of the terms used throughout this application have been redefined by the American National Standard Institute in their new Packaging Material Standards for ESD Sensitive Items E1A-541, published in June of 1988. In these new standards, packaging materials are defined as being in the "conductive" range if they have a measurable surface resistivity of less than $10^5$ ohms per square and a volume resistivity of less than $10^4$ ohms per square. The new standard, ANSI/E1A-541-1988, defines "static-dissipative materials" (formerly known as static-dissipative or anti-static material) as those having a surface resistivity greater than $10^5$ ohms/square, but less than $10^{12}$ ohms/square. And, these same standards now define "insulative materials" as those having surface resistivity equal to or greater than $10^{12}$ ohms/square. "Anti-static materials" are now defined by these new standards as those materials which minimize electrostatic charge when rubbed against or separated from themselves or other similar materials. For purposes of this application, and when used in this application, the terms "anti-static," "static-dissipative," "conductive" and "insulative" shall be used as defined in the new definitions contained in ANSI/E1A-541-1988.

Figure 1:
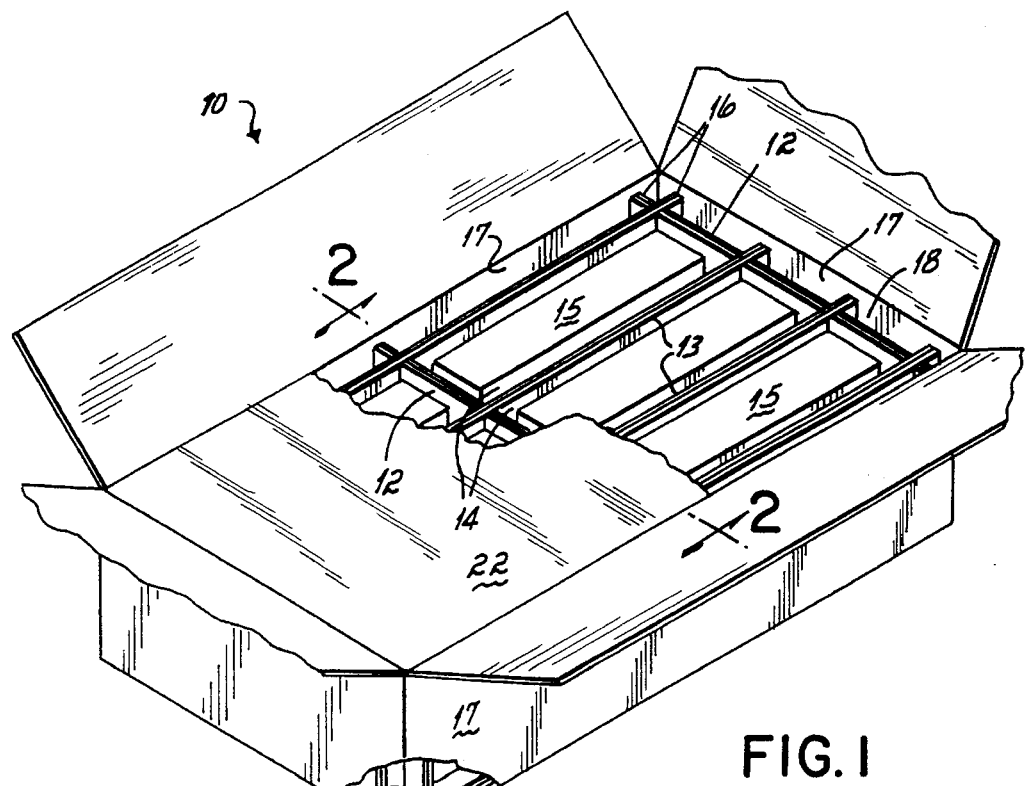
FIG. 1 is a perspective view of a corrugated container, with a plurality of packaging cells partially defined therein by transverse and longitudinal dividers of the multiple-ply, naturally degradable static-dissipative paperboard of this invention.

With reference first to FIG. 1, there is illustrated a container 10 embodying the invention of this application. This container 10 is fitted therein with transverse dividers or partitions 12 and longitudinal dividers or partitions 13 which define the side walls of a plurality of cells 14. Each cell 14 is designed to hold an article 15 to be shipped. Both the transverse dividers 12 and the longitudinal dividers 13 have some excess portion 16 which extends beyond an adjacent cell 14 and into contact with side panels 17 of the container 10, thereby defining a plurality of voids 18 or empty spaces which remain unused. As known in the container industry, the transverse dividers 12 have vertically, downwardly extending slits, and the longitudinal dividers 13 have corresponding vertically, upwardly extending slits, to enable interfitting of the dividers within the container 10 to partially define the cells 14. Alternately, the vertical slits in the transverse divider 12 may be upwardly extending and the vertical slits in the longitudinal dividers 13 may extend downwardly.

Figure 2:
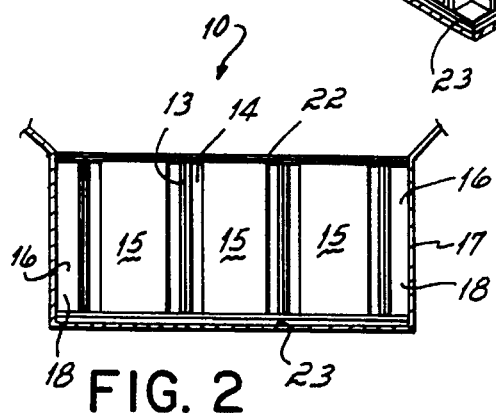
FIG. 2 is a cross-sectional view taken on lines 2—2 of FIG. 1.

As shown in FIG. 2, a lower pad 23 resides beneath the dividers, and an upper pad 22 overlays the dividers to completely enclose the cells 14. According to the invention, the transverse dividers 12, the longitudinal dividers 13, and the top 22 and bottom 23 pads are comprised of a multiple-ply static-dissipative paperboard 25, which is shown in FIG. 3.

Figure 3:
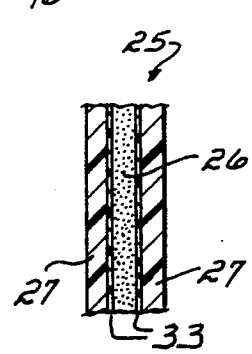
FIG. 3 is a cross-sectional view of the preferred embodiment of a multiple-ply, naturally degradable static-dissipative paperboard of this invention.

As shown in FIG. 3, the multiple-ply static-dissipative paperboard 25 comprises a layer of paperboard or fiberboard 26 which is preferably sandwiched between two films of glassine or cellophane 27, which are by nature permanently static-dissipative and have a surface resistivity greater than $10^5$ ohm/square and less than $10^{12}$ ohm/square. The preferred inner layer 26 is a relatively rigid ply of paperboard formed by a conventional paper making slurry process to create a fiberboard or paperboard sheet. The insulative, conductive, or static-dissipative properties of the paperboard 26 are not typically critical to the practice of this invention. It is only critical that the inner layer 26 be relatively rigid such that it may be self-standing and provide physical protection to articles contained in the cells of the container.

In this embodiment, permanently static-dissipative films 27 of glassine or cellophane are laminated onto the opposite sides of the paperboard 26. The films 27 are preferably about 0.0015" thick. The internal, adhered surfaces of the films 27 are metallized by particles of one or more of the following elements: nickel, aluminum, copper or iron. Of these materials, nickel is the least expensive, but also the most brittle. Aluminum is the most common metal in the earth's crust and it provides excellent wearability at a slightly higher cost than nickel. Copper is more expensive than either aluminum or nickel, but provides excellent wearability. Iron foil can provide the additional protection of magnetic shielding. The film 27 may be metallized in any suitable manner, as by sputtering or chemical evaporation, though chemical evaporation in a vacuum appears to be preferable. The degree of metallization must be sufficient to render the interior surface conductive, as defined by ANSI standards. Generally, a surface coating with a thickness of about 0.002 mils (two one millionths of an inch) is sufficient. Numeral 29 designates the metallized interior surface of each of the films 27.

All of the components of this packaging material 25 are naturally degradable and recyclable. The paperboard 26, the film 27 of glassine or cellophane and the cold set adhesive are biodegradable and repulpable. Comparatively, glassine is preferable over cellophane because it is more easily recyclable. Also, cellophane generally takes longer to break down than the paperboard 26. Due to the economics of papermaking from repulped paper, when using cellophane for film 27, it is presently more feasible to filter out the cellophane from the paperboard, rather than take the time or effort to break it down into a usable state. Nevertheless, the filtered out, partially broken down cellophane does not present an environmental problem because it is biodegradable.

The metallized coating on the interior of the layer 27 constitutes, on a relative scale, such a small percentage of the total volume and weight of the packaging material 25 that the relevant government agencies would consider the coating to be naturally degradable. With regard to recyclability, again, the quantity of metallized particles is so small that it does not affect the repulpable nature of the packaging material 25. In fact, this quantity of metallized particles compares to the coating thickness of ink that normally appears as newsprint on newspapers, which are now commercially recycled. It should also be noted that carbon black, used to make conductive ink, poses a suspected health hazard, while the metallized particles do not pose such a hazard. Moreover, cellophane and glassine on the other hand are FDA approved and commonly used to package food.

Figure 4:
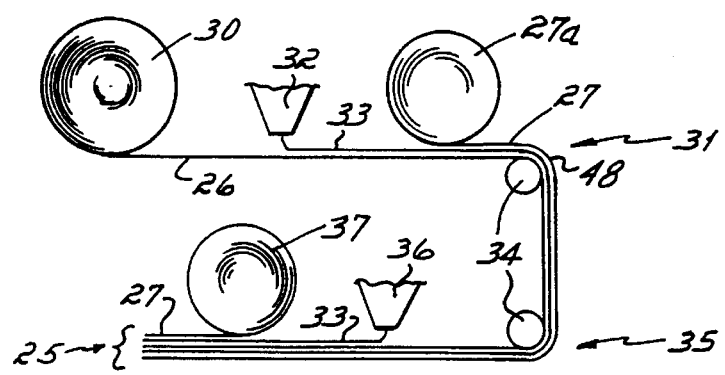
FIG. 4 is a diagrammatic illustration of a method of forming the paperboard of FIG. 3.

FIG. 4 illustrates schematically the manner in which the paperboard product 25 of FIG. 3 is manufactured. A roll 30 of paperboard 26 is unwound at a first level 31. At a first station 32, a thick coating 33 of adhesive is applied onto the top side of the paperboard 26. Before the adhesive sets, a first ply of static-dissipative glassine or cellophane 27 is unwound from a roll 34 and applied over the top surface of the film 33. In some applications, the glassine or cellophane 27 of roll 34 has preferably been metallized on the surface that is adhered to the paperboard 26. Rollers 34 then direct the paperboard 26 with one film of precast static-dissipative glassine or cellophane 27 applied thereto, to a second level 35. As the paperboard 26 moves along the second level 35, the paperboard 26 passes beneath a second station 56 at which a second thin coating 33 of adhesive is applied to the now top surface (formerly the undersurface) of the paperboard 26. Before this second coating 33 of adhesive sets, a second film 27 of static-dissipative glassine or cellophane is unrolled from a roll 37 onto the top surface of the coating 33. Preferably, the roll 37 has also been metallized on what will eventually become the paperboard 26 contacting surface. The adhesive is preferably a vegetable based or an aliphatic resin, such as Elmer's glue, though any one of a number of various types of adhesives may be used.

When the coatings 33 are solidified, they permanently secure the top and bottom films 27 to the paperboard 26, which is now sandwiched therebetween. The naturally degradable and recyclable multiple-ply, static-dissipative paperboard 25 is now ready to be cut for use.

Thus, according to one preferred embodiment of the invention, a layer of paperboard 26 or other relatively rigid ply of material is sandwiched by films of permanently static-dissipative glassine or cellophane. The static-dissipative layer adjacent the article prevents sloughing or abrading of the paperboard 26 onto articles packaged in the material, which could cause circuit damage. It also combats generation or holding of static electricity resulting form relative movement of the protected articles and the packaging paperboard. The glassine or cellophane layer is also electrostatically volume dissipative, therefore it does not hold an inadvertently generated electrostatic charge. Therefore, it constitutes an improvement over prior three tiered packaging materials which have an inherent tendency to act as capacitors.

The multiple-ply static-dissipative paperboard 26 also provides sufficient rigidity to physically protect packaged articles. This physical protection is achieved with a savings in material and labor, as compared to packaging requiring a bag.

The multiple-ply static-dissipative paperboard of this invention has the advantage of incorporating materials which inherently have the desired electrical characteristics. Otherwise expressed, the invention of this application, because of its permanence, has no finite shelf life. Heretofore, many anti-static and/or static dissipative coatings or materials have been produced by doping or coating polypropylene (more common is polyethylene) or other plastic materials with an amine or amide compound so as to impart the anti-static or static-dissipative property to the polypropylene plastic. Those compounds, though, were slowly dissipated or outgassed from the polypropylene plastic over a period of time with the result that the polypropylene plastic lost its anti-static or static-dissipative property over a period of time. Consequently, such material had a limited shelf life.

Because the multiple-ply static-dissipative paperboard of this invention is amine free, the material does not cause amine corrosion of metal packaged within such amine-free material. Additionally, many printed electrical circuits are imprinted on polycarbonate plastic, which plastic is subject to stress cracking when subjected or exposed to chemicals which result from amine breakdown. The invention of this application, because it contains no amines, does not have this adverse effect upon polycarbonate. Anti-static or static-dissipative plastics which contain or are coated with amines and amides are also humidity sensitive, i.e., they are only operative and only maintain their anti-static or static-dissipative properties so long as there is some minimal humidity level maintained in the atmosphere. The prior amide and amine-containing anti-static or static-dissipative plastics therefore are not operative in very dry atmospheres to which such anti-static materials are often exposed. The invention of this application retains its static protective functionality even at very low humidities.

The multiple-ply static-dissipative paperboard of this invention may be made to provide chemical protection for packaged articles. For example, a corrosion inhibitor commonly referred to as Cobra Tech, manufactured by PMC Specialty and formerly made by Sherwin Williams, may be coated onto the outer surface of the film 27 prior to application of the film 27 to the interior layer 26 in order to protect copper or copper alloyed articles. This substance neutralizes potentially corrosive sulfuric compounds which may be contained in the paper. Similarly, other corrosion inhibitors could be used with other types of articles, depending upon the metal that is required to be protected. Because the static-dissipative glassine and/or cellophane films of the preferred embodiment are relatively stable, they will physically shield the packaged article from chemical corrosion. Thus, the addition of a corrosion inhibitor for this embodiment would not be necessary, but would provide added protection against chemical corrosion.

Figure 5:
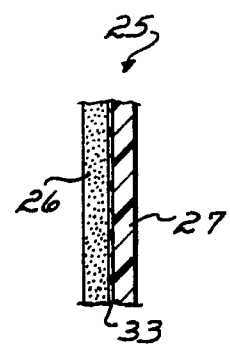
FIG. 5 is a cross-sectional view of an alternative embodiment of the multiple-ply naturally degradable static-dissipative paperboard of this invention.

While I have heretofore described one preferred embodiment of the multiple-ply static-dissipative material of this invention as embodying a single ply of paperboard or other relatively rigid material sandwiched between two plies or films of static-dissipative glassine or cellophane, the invention of this application contemplates that such a multiple-ply packaging material may comprise only a single film 27 of glassine or cellophane on one side of the base material 26, as illustrated in FIG. 5. Such a multiple-ply product is particularly useful in many packaging applications wherein only a single side of the material may be exposed to electrical components or static-sensitive articles. One such application for single-side coated, multiple-ply static-dissipative material is in the production of corrugated paperboard material used in the manufacture of boxes or containers within which static-sensitive electrical components or articles may be packaged.

When used to produce permanently static-dissipative corrugated paperboard, the base ply of paperboard is first corrugated and then laminated on one side or both sides with a film of static-dissipative glassine or cellophane. Alternatively, the base ply can be laminated and then corrugated.

The preferred embodiment of the invention described hereinabove employs either glassine or cellophane, materials that are both biodegradable and repulpable. Alternatively, the external film 27 or films may also be formed of any other material that is permanently static-dissipative and naturally degradable. For instance, it would be possible to form film 27 out of ethyl vinyl acetate, or other substances formed from an acidified viscose. It would also be possible to form film 27 out of a conventional plastic rendered biodegradable by the addition of a corn starch additive. Preferably, the external film 27 or films are also recyclable. For paper-based packaging materials, this generally means that they are repulpable.

While I have described only a limited number of embodiments of the multiple-ply static-dissipative paperboard of this invention, it is to be understood that the invention is not to be limited solely to these embodiments. Various other alternative embodiments will be readily apparent to persons skilled in this art. Accordingly, it is to be understood that changes may be made without departing from the scope of the invention as particularly set forth and described.

I claim:

1. A container for packaging an article which can be damaged by static electricity, comprising:

a box having sidewalls and top and bottom walls;

a plurality of relatively rigid dividers located in said box, each said divider comprising a layer of relatively rigid material sandwiched between two films of amine free permanently static-dissipative materials, each of said two films of static-dissipative material having a surface resistivity of greater than $10^5$ but less than $10^{12}$ ohms per square, the layer of relatively rigid material being sandwiched between the two films while the films are in a solid state, and each of the films having the same solid, amine free permanently static dissipative characteristics before and after said sandwiching; and wherein said dividers partially define a predetermined number of cells within said box, each said cell providing protection from electrostatic charge for static electricity sensitive articles to be packaged therein, the dividers being naturally degradable.

2. A container as in claim 1 further comprising:

a relatively rigid top pad located between said top wall of said box and said dividers;

a relatively rigid bottom pad located between said bottom wall of said box and said dividers;

wherein each said pad comprises a layer of relatively rigid material laminated on at least one side with a film of permanently static-dissipative material; and said pads and said dividers completely surrounding said cells with a film of naturally static-dissipative material, the dividers and pads further being naturally degradable.

3. A container for packaging an article which can be damaged by static electricity, comprising:

a box having sidewalls and top and bottom walls;

a plurality of relatively rigid dividers located in said box, each said divider comprising a layer of relatively rigid material sandwiched between two films of permanently static-dissipative materials, each of said two films of static-dissipative material having a surface resistivity of greater than $10^5$ but less than $10^{12}$ ohms per square; and wherein said dividers partially define a predetermined number of cells within said box, each said cell providing protection from electrostatic charge for static electricity sensitive articles to be packaged therein, the dividers being naturally degradable wherein said permanently static-dissipative material comprises a material selected from the following two materials, glassine and cellophane.

4. A container as in claim 1 and further comprising:

a relatively rigid top pad located between said top wall of said box and said dividers;

a relatively rigid bottom pad located between said bottom wall of said box and said dividers;

wherein each said pad comprises a layer of relatively rigid material laminated on at least one side with a film of permanently static-dissipative material; and said pads and said dividers completely surrounding said cells with a film of naturally static-dissipative material, the dividers and pads further being naturally degradable wherein said permanently static-dissipative material comprises a material selected from the following two materials, cellophane and glassine.

5. A container as in claim 1 or claim 2 wherein for each of said pads and dividers, internal surfaces of the two films of permanently static-dissipative material are electrically conductive.

6. A container as in claim 5 wherein each of said internal surfaces is metallized with one or more elements selected from the group of nickel, aluminum, copper and iron to render said surface electrically conductive.

7. The container of claim 1 wherein the layers of relatively rigid material are corrugated.

8. A container for use in packaging an article which can be damaged by static electricity, comprising:

a box having sidewalls and top and bottom walls;

a plurality of relatively rigid dividers located in said box, each said divider comprising a layer of paperboard sandwiched between two films of amine free permanently static-dissipative material, each of said two films of permanently static-dissipative material having a surface resistivity of more than $10^5$ but less than $10^{12}$ ohms per square, the dividers being naturally degradable, the layer of relatively rigid material being sandwiched between the two films while the films are in a solid state, and each of the films having the same solid, amine free permanently static dissipative characteristics before and after said sandwiching; and wherein said dividers partially define a predetermined number of cells within said box, each said cell being volume dissipative from electrostatic charge to provide protection from static electricity for a static electricity sensitive article to be packaged therein.

9. The container of claim 8 wherein the dividers are repulpable.

10. The container of claim 8 wherein the layers of paperboard are corrugated.

11. A multiple-ply packaging material comprising:

a layer of relatively rigid material having first and second surfaces;

a film of amine free permanently static-dissipative material applied to one of said first and second surfaces, said film having a surface resistivity of more than $10^5$ but less than $10^{12}$ ohms per square, said film being applied to the layer of relatively rigid material while in a solid state, and the film having the same solid, amine-free permanently static dissipative characteristics before and after said applying, said layer and said film being naturally degradable.

12. A multiple-ply material as in claim 11 wherein said layer comprises paperboard.

13. A multiple-ply material as in claim 12 wherein said layer and said film are recyclable.

14. A multiple-ply packaging material comprising:

a layer of relatively rigid material having first and second surfaces;

a film of permanently static-dissipative material applied to one of said first and second surfaces, said film having a surface resistivity of more than $10^5$ but less than $10^{12}$ ohms per square, said layer and said films being naturally degradable, wherein said film comprises cellophane.

15. A multiple-ply packaging material comprising:

a layer of relatively rigid material having first and second surfaces;

a film of permanently static-dissipative material applied to one of said first and second surfaces, said film having a surface resistivity of more than $10^5$ but less than $10^{12}$ ohms per square, said layer and said films being naturally degradable, wherein said film comprises glassine.

16. A multiple-ply material as in claim 11 wherein said permanently static-dissipative material has a conductive coating in surface contact with said one of said first and second surfaces of said layer.

17. A multiple-ply material as in claim 16 wherein said conductive coating comprises metallized particles of one or more elements selected from the group of nickel, aluminum, copper and iron.

18. The multiple ply packaging material of claim 11 wherein the relatively rigid material is corrugated.

19. A multiple-ply paperboard comprising:

a first film of amine free, permanently static-dissipative material;

a second film of amine free, permanently static-dissipative material;

a layer of paperboard having first and second sides, said first and second films being applied to said first and second sides, respectively, of said paperboard so as to sandwich said paperboard between said first and second films, said first and second films having a natural surface resistivity of more than $10^5$ but less than $10^{12}$ ohms per square, said layer of paperboard being applied between the two films while the films are in a solid state, and each of the films having the same solid, amine-free permanently static dissipative characteristics before and after said application, said first and second films and said layer being naturally degradable and recyclable.

20. The multiple ply paperboard of claim 19 wherein the layer of paperboard is corrugated.

21. A multiple-ply packaging material comprising:

a first film of amine free, permanently static-dissipative material;

a second film of amine free, permanently static-dissipative material;

a layer of relatively rigid material having first and second sides, said first and second films being applied to said first and second sides, respectively, of said relatively rigid material so as to sandwich said relatively rigid material between said first and second films, said first and second films having a surface resistivity of more than $10^5$ but less than $10^{12}$ ohms per square, said layer of relatively rigid material being applied between the two films while the films are in a solid state, and each of the films having the same solid, amine-free permanently static dissipative characteristics before and after said application, said first and second films and said layer being naturally degradable.

22. The multiple ply packaging material of claim 21 wherein the layer of relatively rigid material is corrugated.

23. A multiple-ply packaging material comprising:

a first film of permanently static-dissipative material;

a second film of permanently static-dissipative material;

a layer of relatively rigid material having first and second sides, said first and second films being applied to said first and second sides, respectively, of said relatively rigid material so as to sandwich said relatively rigid material between said first and second films, said first and second films having a surface resistivity of more than $10^5$ but less than $10^{12}$ ohms per square and said first and second films and said layer being naturally degradable, wherein said permanently static-dissipative material comprises a material selected from the following two materials, glassine and cellophane.

24. A multiple-ply material as in claim 21 or 23 wherein said layer comprises paperboard.

25. A multiple-ply material as in claim 21 or claim 23 wherein each of said first and second films of permanently static-dissipative material include an inner conductive surface adhered to one of said first and second sides of said layer.

26. A multiple-ply material as in claim 21 or claim 23 wherein said first and second films and said layer are biodegradable.

27. A multiple-ply material as in claim 21 or claim 23 wherein said first and second films and said layer are repulpable.

* * * * *